US 6,690,566 B2

United States Patent
Seely et al.

(10) Patent No.: US 6,690,566 B2
(45) Date of Patent: Feb. 10, 2004

(54) TRIGGER CIRCUIT FOR MARX GENERATORS

(75) Inventors: John F. Seely, Lorton, VA (US); Craig N. Boyer, Mitchellville, MD (US); Glenn E. Holland, Wheaton, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 349 days.

(21) Appl. No.: 09/778,950

(22) Filed: Feb. 8, 2001

(65) Prior Publication Data

US 2002/0105773 A1 Aug. 8, 2002

(51) Int. Cl.[7] .................................................. F23Q 3/00
(52) U.S. Cl. ........................ 361/263; 361/257; 307/108
(58) Field of Search ................................ 361/253, 256, 361/257, 263; 307/106, 108, 109, 110; 372/81–83, 86; 323/288; 363/59

(56) References Cited

U.S. PATENT DOCUMENTS

| | | | | |
|---|---|---|---|---|
| 3,256,439 A | | 6/1966 | Dyke et al. .................. | 307/110 |
| 3,878,449 A | * | 4/1975 | Wilhelmi et al. ........... | 307/108 |
| 4,189,650 A | * | 2/1980 | Aaland ........................ | 307/108 |
| 5,311,067 A | | 5/1994 | Grothaus et al. ........... | 307/108 |

OTHER PUBLICATIONS

Boyer et al.; "A pulsed hard x–ray source for nondestructive testing and medical imaging"; 1999 SPIE—The International Society for Optical Engineering; pp. 1–11, no month.

* cited by examiner

Primary Examiner—Ronald W. Leja
(74) Attorney, Agent, or Firm—John J. Karasek; L. George Legg

(57) ABSTRACT

A trigger circuit is provided for a trigger system for a Marx generator column. The column includes a plurality of metal electrode pairs wherein the electrodes of each pair are spaced to form a spark gap therebetween and a capacitor is connected across each gap. The trigger system includes a three electrode (trigatron) spark gap switch forming the first spark gap of the Marx generator column. The triggering circuit includes a trigger transformer having primary and secondary windings. The secondary winding is connected through a connecting cable to a blocking capacitor of an input circuit of the trigatron switch. A charging capacitor is connected to an oscillator power supply so as to be charged thereby to the output voltage (e.g., 345 volts) of the oscillator power supply. An electronic switch (e.g., an SCR) is connected to a junction between the charging capacitor and the oscillator power supply for, when actuated by an input pulse, completing a connection between the capacitor and the primary winding of the trigger transformer so that a high voltage trigger pulse is produced at the secondary winding of the trigger transformer.

10 Claims, 1 Drawing Sheet

TRIGGER CIRCUIT FOR MARX GENERATORS

FIELD OF THE INVENTION

The present invention relates to Marx generators and, more particularly, to an improved trigger circuit for triggering a Marx generator.

RELATED ART

X-ray machines that generate X-rays from cold field emission of electrons from the cathode of an X-ray tube are commonly employed in pulsed shadowgraph radiographs. Pulsed or flash shadowgraph radiograph was developed in 1938 as a means for observing extremely rapid motion where the subject was obscured from observation with visible light or debris. To date, flash radiography remains the principal means of observing lensed implosions and ballistic impacts over microsecond and nanosecond time scales. The majority of these X-ray systems utilize the well known Marx generator which can be viewed as a distributed transmission-storage line, consisting of n-cascaded high-voltage capacitors each connected across an associated spark gap switch. To produce X-rays, the Marx generator is coupled to a field emission X-ray tube either directly or by coaxial cables and is triggered to initiate a spark discharge at the surface of the positive electrode of the first spark gap switch.

In one prior art triggering technique, a separate ultraviolet (UV) illuminator has been employed in combination with a separate charging capacitor. This capacitor is charged from the Marx high-voltage supply. It has been found that at low Marx charging voltages, the UV pulse from the illuminator does not reliably photoionize the first spark gap switch.

In our earlier publication, Boyer et al, Pulsed Hard X-Ray Source for Nondestructive Testing and Medical Imaging, Proc. SPIE, Vol. 3154, p. 16–26 (1997), we disclose a triggering arrangement wherein the first spark gap switch is modified by use of a three electrode "trigatron" switch described below. The switch includes a first, host electrode having incorporated therein an insulator containing a central trigger pin, and a second, grounded electrode. A 25 kV pulse discharge between the trigger pin and the host electrode provides rapid closure of the gap between the first and second electrodes.

In addition to our own earlier patents, other patents of interest include U.S. Pat. No. 5,311,067 to Grothaus et al. which discloses a Marx-type generator for producing a high voltage burst of pulses having a high repetition ratio and including a trigatron switch, and U.S. Pat. No. 3,256,439, which discloses a high voltage and high current pulse generator combined with an X-ray tube and including ball electrodes defining a spark gap and a triggering electrode.

SUMMARY OF THE INVENTION

In accordance with the invention, an improved trigger circuit for the triggering arrangement of our earlier publication (Boyer et al) is provided. The trigger can be made quite small so that the volume of the overall trigger generator can be reduced to a few cubic inches. This permits connection of the generator through a short cable having little parasitic capacitance. The resultant reduction in the risetime of the high voltage pulse reduces the trigger jitter of the associated Marx generator.

In accordance with the invention, a triggering circuit is provided for a triggering system for a Marx generator column comprising a plurality of metal electrode pairs wherein the electrodes of each pair are spaced to form a spark gap therebetween and a capacitor is connected across each gap, the triggering system comprising a three electrode spark gap switch forming the first spark gap of the Marx generator column and the trigger circuit comprising: a trigger transformer having a primary winding and a secondary winding, the secondary winding being connected to the three electrode spark gap through a connecting cable; an oscillator power supply for producing an output voltage; a charging capacitor connected to the oscillator power supply so as to be charged thereby to said output voltage; and an electronic switch connected to a junction between the charging capacitor and said oscillator power supply for, when actuated by an input pulse, completing a connection between the capacitor and the primary winding of the trigger transformer so that a high voltage trigger pulse is produced at the secondary winding of the trigger transformer.

Advantageously, the trigger further comprises a pulse generator circuit connected to an electronic switch for, responsive to receiving a trigger pulse, generating said input pulse for actuating the electronic switch. Preferably, the pulse generator circuit includes a further electronic switch including an input terminal for receiving said trigger pulse and an output terminal, and a further transformer including a primary winding connected to the output terminal of the second electronic switch, and a secondary winding connected to a control input of the first electronic switch. Advantageously, a resistor is connected in a series circuit including said output terminal of the second electronic switch and the primary winding of the further transformer. A further resistor is preferably connected in parallel with the series circuit of the resistor and the primary winding.

Preferably, a common supply bus is connected to the second electronic switch and to the oscillator power supply. A radio frequency choke is advantageously connected between the supply bus and the oscillator power supply.

Preferably, the second electronic switch comprises a transistor having a base and an emitter-collector circuit, and a NAND gate is connected to the base of the transistor. Advantageously, the emitter-collector circuit of the transistor is connected between the common supply bus and the secondary winding of the second transformer. A stabilizing capacitor is preferably connected in a connection between the emitter of said transistor and ground. The first mentioned electronic switch preferably comprises a silicon controlled rectifier. A diode is advantageously connected in parallel with the charging capacitor.

Further features and advantages of the present invention will be set forth in, or apparent from, the detailed description of preferred embodiments thereof which follows.

BRIEF DESCRIPTION OF THE DRAWINGS

The single FIGURE in the drawings is a schematic circuit diagram of a Marx generator triggering system including a trigger circuit in accordance with a preferred embodiment of the invention.

DESCRIPTION OF THE PREFERRED EMBODIMENTS

Figure 1:
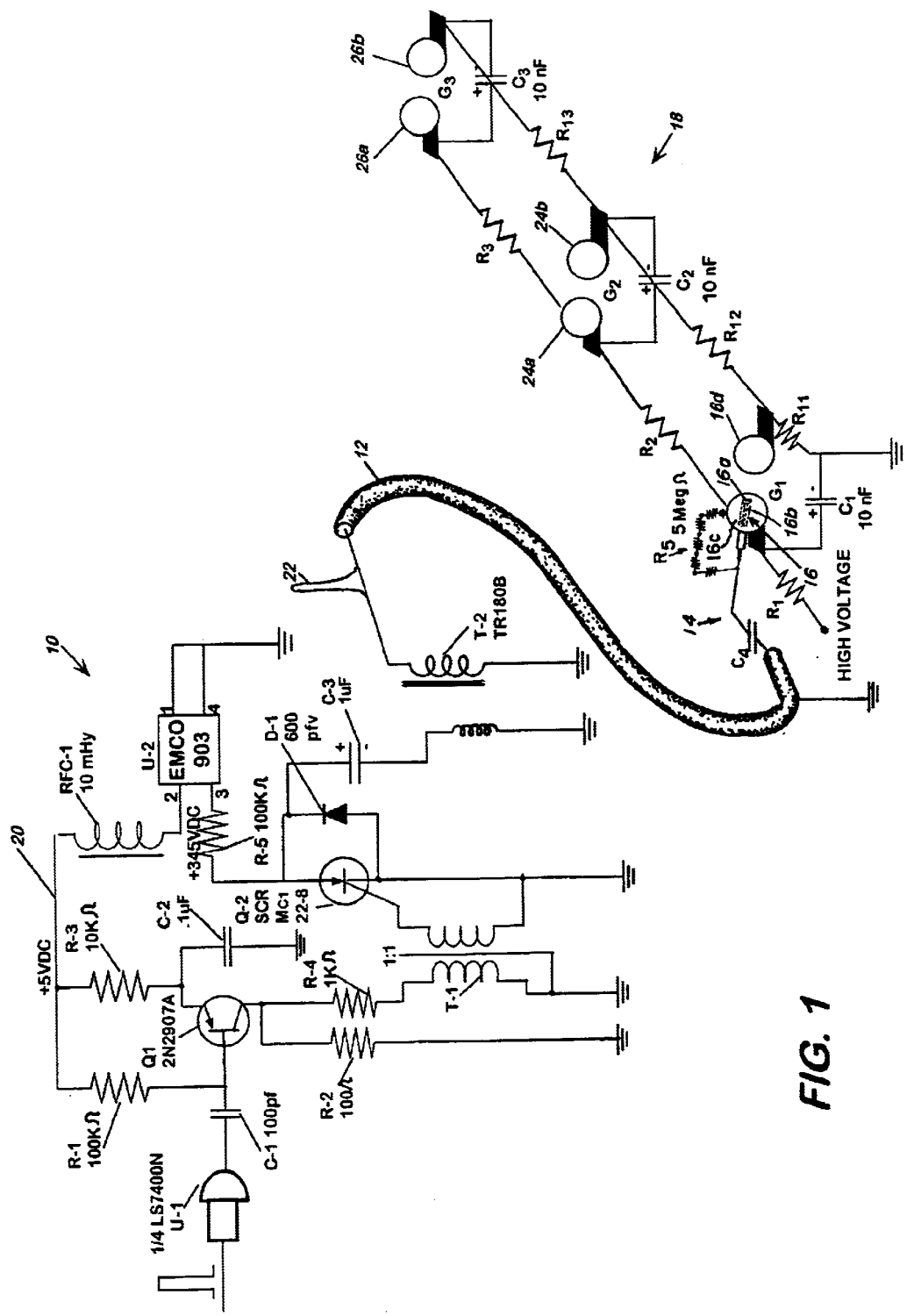

Referring to the single FIGURE of the drawings, a Marx generator triggering arrangement is shown. The triggering arrangement includes a trigger circuit, generally denoted 10 and which is constructed in accordance with a preferred embodiment of the invention, for generating a high voltage trigger pulse. The latter is coupled through a double shielded coaxial cable 12 to a trigatron switch circuit, generally denoted 14, and corresponding to that described in the Boyer et al publication referred to above. The latter includes a trigatron spark gap switch 16 which forms part of a Marx generator which is represented schematically in the drawings and is generally denoted 18.

Trigger circuit 10 includes a NAND gate U-1 which receives a positive going voltage pulse having an amplitude between 2.5–4.5 volts. In its quiescent state, the output of NAND gate U-1 is high, about 4.5 volts, but promptly drops to a low level, about 0.2 volts, when its gates thereof are driven high. A capacitor C-1 is connected to the output of NAND gate U-1 and the negative-going pulse created when NAND gate U-1 is driven low, generates a displacement current in capacitor C-1 that flows away from the junction of capacitor C-1 and a resistor R1, connected to the 5 volt DC supply bus or line 20. This junction is connected to the base of a transistor Q-1 and the displacement current so generated forward biases the base-emitter junction of transistor Q-1, held at cutoff by resistor R-1, thereby sending Q-1 into conduction.

The emitter of transistor Q-1 is connected to the junction of a further resistor R-3 connected to DC supply bus 20 and a capacitor C-2 connected to ground. Capacitor C-2 is charged by 5 volts DC by resistor R-3 so that, when transistor Q-1 conducts, the stored charge of capacitor C-2 can be used to stabilize the emitter-ground potential of transistor Q-1 during the time which current flows from the collector of transistor Q-1.

The collector circuit of transistor Q-1 includes parallel resistors R-2 and R-4 and a transformer T-1. A portion of the collector current of transistor Q-1 flows through resistor R-4 and the primary winding of transformer T-1. Resistor R-2 is connected in parallel with the complex impedance (RLC circuit) formed by resistor R-4, the magnetizing inductance in the primary winding of transformer T-1 and stray capacitance between the primary winding of transformer T-1 and its shielded secondary winding. The purpose of resistor R-2 is to critically damp or spoil the Q of this RLC circuit. Resistor R-4 is necessary in order to prevent the logical voltage noise or the 5 volt power supply line or bus 20 from generating voltage spikes at the secondary of transformer T-2 of sufficient amplitude to trigger the silicon controlled rectifier (SCR) Q-2 connected to the secondary winding of transformer T-1. The gate and cathode of SCR Q-2 are connected across the secondary winding of transformer T-1 with the gate being connected to the positive output thereof. When current from the collector of transistor Q-1 flows into the primary winding of transformer T-1 (as indicated by the black dot in the drawings), a positive going pulse is produced at the positive output of the secondary winding of transformer T-1 (also indicated by a black dot).

A diode D-1 is connected across SCR Q-2 and a capacitor C-3 is connected to the junction therebetween as well as to the primary winding of a second transformer T-2. An oscillator power supply U-2 is also connected to this junction through a resistor R-5. When the amplitude of the positive pulse appearing at the gate of SCR Q-2 exceeds the trigger threshold thereof, which is about 0.6 volts, the SCR Q-2 rapidly conducts and connects capacitor C-3, charged by resistor R-5 to 345 volts DC from oscillator power supply U-2, to the primary winding of transformer T-2. An r.f. choke RFC-1 prevents oscillator noise from oscillator power supply U-2 from entering the 5 volt DC supply bus. Diode D-1 is connected across the anode and cathode of SCR Q-2 to protect the SCR Q-2 from large voltage reversals caused by "ringing" of the primary of transformer T-2.

The −345 volt pulse generated by the discharge of capacitor C-3 into the positive input of primary winding of transformer T-2 (marked with a black dot) produces a −25 kV at the positive output of the secondary winding of transformer T-2 (also marked with a black dot).

The 25 kV pulse produced by transformer T-2, which is indicated schematically at 22, travels along coaxial cable 12 and is coupled through a high voltage blocking capacitor $C_4$ so as to appear at the trigger pin 16a of the three electrode trigatron spark gap switch 16. Switch 16 and its associated circuitry are described in the Boyer et al publication to which reference was made above. Switch 16 includes an insulating cylinder of alumina 16b enclosing the triggering pin 16a. The cylinder 16b passes diametrically through a first spherical metal electrode 16c. A second spherical metal electrode 16d is separated form the first electrode 16c by a gap having a width sufficient to withstand the highest charging voltage expected on capacitor $C_1$ of Marx generator 18 at the designated nitrogen gas operating pressure of the Marx column without gap breakdown. The trigger pin 16a is held at the potential of its host electrode 16c by a series of 5 megaohm resistors $R_5$ which are connected between electrode 16c and the trigger pin 16a.

The trigatron switch 16 initiates closure by both ionization and field distortion. Switch closure begins when the potential of trigger pin 16a is suddenly lowered by the −25 kV pulse 22 coupled thereto by capacitor $C_4$. This launches a discharge to the host electrode 16c and induces formation of a spark channel in the gap $G_1$ between the spherical electrodes 16c and 16d of the trigatron switch 16. Two stages of spark channel formation may be distinguished: a threading of the gap with filamentary discharges on application of the trigger pulse 22 and the development of a main stroke propagating at $10^8$ to $10^9$ cm/sec. This is due to the formation of a weak, exponentially growing Townsend avalanche in a conducting filament of highly ionized gas. This constitutes the initial stage of spark formation through which the first capacitor $C_1$ of the Marx column discharges.

The Marx generator 18 is conventional and includes further electrode pairs 24a and 24b, and 26a and 26b, forming further spark gaps $G_2$ and $G_3$, further capacitors $C_2$ and $C_3$ connected across these gaps and connecting resistors $R_1$, $R_2$ and $R_3$ and $R_{11}$, $R_{12}$ and $R_{13}$, connected as shown. Once gap G1 breaks down, a second spark gap forms between the two metal (e.g., brass) electrodes 16c and 16d and charge flows toward the low potential electrode connected to capacitor $C_2$. Since capacitor $C_2$ is charged to the potential of capacitor $C_1$, the potential across gap $G_2$ is doubled. This stress cannot be maintained and gap $G_2$ breaks down. This triples the stress on gap $G_3$ which also breaks down. The entire array of spark gaps then breaks down consecutively and this results in complete erection of the Marx column in about 10 Ns. In a preferred embodiment, the high voltage pulse produced appears across the anode-cathode gap of an associated X-ray tube (not shown).

Although the invention has been described above in relation to preferred embodiments thereof, it will be understood by those skilled in the art that variations and modifications can be effected in these preferred embodiments without departing from the scope and spirit of the invention.

What is claimed:

1. A trigger circuit for a triggering system for a Marx generator column comprising a plurality of metal electrode pairs wherein the electrodes of each pair are spaced to form a spark gap therebetween and a capacitor is connected across each gap, said triggering system comprising a three electrode spark gap switch forming the first spark gap of the Marx generator column, said trigger circuit comprising:

a trigger transformer having a primary winding and a secondary winding, said secondary winding being connected to said three electrode spark gap of said triggering system through a connecting cable;

an oscillator power supply for producing an output voltage;

a charging capacitor connected to said oscillator power supply so as to be charged thereby to said output voltage;

an electronic switch connected to a junction between said charging capacitor and said oscillator power supply for, when actuated by an input pulse, completing a connection between said capacitor and said primary winding of said trigger transformer so that a high voltage trigger pulse is produced at the secondary winding of the trigger transformer; and a pulse generator circuit connected to said electronic switch for, responsive to receiving a trigger pulse, generating said input pulse for actuating said electronic switch;

wherein said pulse generator circuit includes a second electronic switch including an input terminal for receiving said trigger pulse and an output terminal, and a further transformer including a primary winding connected to the output terminal of the second electronic switch, and a secondary winding connected to a control input of said first electronic switch.

2. A circuit according to claim 1 further comprising a resistor connected in a series circuit including said output terminal of said second electronic switch and said primary winding of said further transformer.

3. A circuit according to claim 2 further comprising a further resistor connected in parallel with the series circuit of said resistor and said primary winding.

4. A circuit according to claim 1 wherein a common supply bus is connected to said second electronic switch and to said oscillator power supply.

5. A circuit according to claim 4 further comprising a radio frequency choke connected between said supply bus and said oscillator power supply.

6. A circuit according to claim 5 wherein said second electronic switch comprises a transistor having a base and an emitter-collector circuit, wherein a NAND gate is connected to the base of said transistor.

7. A circuit according to claim 6 wherein said emitter-collector circuit of said transistor is connected between said supply bus and said primary winding of said further transformer.

8. A circuit according to claim 7 comprising a stabilizing capacitor connected in a connection between the emitter of said transistor and ground.

9. A circuit according to claim 8, wherein the electronic switch connected between the junction between the charging capacitor and the oscillator power supply comprises a silicon controlled rectifier.

10. A circuit according to claim 9 further comprising a diode connected in parallel with said charging capacitor.

* * * * *